US009866206B2

(12) United States Patent
Storms et al.

(10) Patent No.: US 9,866,206 B2
(45) Date of Patent: Jan. 9, 2018

(54) DRIVER CIRCUIT FOR MEMORY DEVICES

(71) Applicant: NXP B.V., Eindhoven (NL)

(72) Inventors: Maurits Storms, Eindhoven (NL); Soenke Ostertun, Hamburg (DE); Frantisek Cevela, Eindhoven (NL)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 15/186,408

(22) Filed: Jun. 17, 2016

(65) Prior Publication Data

US 2016/0373092 A1 Dec. 22, 2016

(30) Foreign Application Priority Data

Jun. 19, 2015 (EP) ..................... 15172890

(51) Int. Cl.
*G11C 16/08* (2006.01)
*H03K 3/356* (2006.01)
(Continued)

(52) U.S. Cl.
CPC ....... *H03K 3/356182* (2013.01); *G11C 16/08* (2013.01); *G11C 16/10* (2013.01);
(Continued)

(58) Field of Classification Search
USPC .................................................. 365/185.23
See application file for complete search history.

(56) References Cited

U.S. PATENT DOCUMENTS

2005/0285623 A1* 12/2005 Jahan ............... H03K 3/356113
326/68
2006/0114737 A1 6/2006 Terasawa et al.
(Continued)

FOREIGN PATENT DOCUMENTS

EP 3 023 990 A1 5/2016
WO 2013/157915 A1 10/2013

OTHER PUBLICATIONS

Extended European Search Report for Patent Appln. No. 15172890.4 (Dec. 18, 2015).
(Continued)

*Primary Examiner* — Hoai V Ho
*Assistant Examiner* — Minh Dinh (57) ABSTRACT

There is described a driver circuit (100) for providing biasing voltages to a flash memory device, the driver circuit comprising (a) a level shifter latch (110) comprising a first latch input terminal (111), a first latch control terminal (112), a latch voltage supply terminal (113), a first latch output terminal (114), and a second latch output terminal (115), wherein the level shifter latch (110) is adapted to provide, in dependency of a voltage at the first latch input terminal (111), one of a first voltage and a second voltage at the first latch output terminal (114) and the other one of the first voltage and the second voltage at the second latch output terminal (115), wherein the first voltage is dependent on a voltage applied to the latch voltage supply terminal (113) and the second voltage is dependent on a voltage applied to the first latch control terminal (112), (b) a first output stage (120) comprising a first switching element (N11, N12), a second switching element (N13), a first voltage supply terminal (122), a second voltage supply terminal (124), and a first biasing voltage output terminal (126), wherein the first switching element (N11, N12) is adapted to connect the first biasing voltage output terminal (126) to the first voltage supply terminal (122) in dependency of the voltage at the first latch output terminal (114), and wherein the second switching element (N13) is adapted to connect the first biasing voltage output terminal (126) to the second voltage supply terminal (124) in dependency of the voltage at the second latch output terminal (115), and (c) a second output stage (130) comprising a third switching element (N21), a fourth switching element (N22), a third voltage supply
(Continued)

terminal (132), a fourth voltage supply terminal (134), and a second biasing voltage output terminal (136), wherein the third switching element (N21) is adapted to connect the second biasing voltage output terminal (136) to the third voltage supply terminal (132) in dependency of the voltage at the first latch output terminal (114), and wherein the fourth switching element (N22) is adapted to connect the second biasing voltage output terminal (136) to the fourth voltage supply terminal (134) in dependency of the voltage at the second latch output terminal (115).There is also described a memory system and a method of operating the driver circuit.

13 Claims, 9 Drawing Sheets

(51) Int. Cl.
  *G11C 16/30* (2006.01)
  *G11C 16/10* (2006.01)
  *G11C 16/26* (2006.01)
  *H02M 3/07* (2006.01)
  *G11C 5/14* (2006.01)
  *G11C 8/08* (2006.01)

(52) U.S. Cl.
  CPC .............. *G11C 16/26* (2013.01); *G11C 16/30* (2013.01); *H02M 3/07* (2013.01); *H03K 3/35613* (2013.01); *G11C 5/14* (2013.01); *G11C 5/147* (2013.01); *G11C 8/08* (2013.01)

(56) References Cited

U.S. PATENT DOCUMENTS

| | | |
|---|---|---|
| 2012/0314505 A1 | 12/2012 | Nam |
| 2013/0229864 A1* | 9/2013 | Conte .................... G11O 5/145 365/163 |
| 2014/0232710 A1 | 8/2014 | Low et al. |
| 2014/0254242 A1* | 9/2014 | Siau .................... G11C 13/0026 365/148 |
| 2014/0369136 A1 | 12/2014 | Hirose et al. |

OTHER PUBLICATIONS

Mesgarani, A. et al, "A 1.2-V 100KS/S Energy Efficient Supply Boosted SAR ADC", IEEE 56th International Midwest Symposium on Circuits and Systems, pp. 1152-1155 (Aug. 2013).

* cited by examiner

DRIVER CIRCUIT FOR MEMORY DEVICES

CROSS-REFERENCE TO RELATED APPLICATIONS

This application claims the priority under 35 U.S.C. §119 of European patent application no. 15172890.4, filed on Jun. 19, 2015, the contents of which are incorporated by reference herein.

FIELD OF THE INVENTION

The present invention relates to the field of driver circuits, in particular to a driver circuit for providing biasing voltages to a memory device and to a method of operating the driver circuit.

ART BACKGROUND

When operating (e.g. reading, erasing and programming) a memory device, appropriate biasing voltages usually have to be provided to the relevant cells in order to select the cells and to prepare them for the operation to be performed. For example, a flash memory device usually receives a control gate (CG) biasing voltage and a select gate (SG) biasing voltage.

There may be a need for a simple and compact driver circuit which is capable of providing such biasing voltages.

SUMMARY OF THE INVENTION

This need may be met by the subject matter according to the independent claims. Advantageous embodiments of the present invention are set forth in the dependent claims.

According to a first aspect of the invention, there is provided a driver circuit for providing biasing voltages to a memory device, in particular a flash memory device. The driver circuit comprises (a) a level shifter latch comprising a first latch input terminal, a first latch control terminal, a latch voltage supply terminal, a first latch output terminal, and a second latch output terminal, wherein the level shifter latch is adapted to provide, in dependency of a voltage at the first latch input terminal, one of a first voltage and a second voltage at the first latch output terminal and the other one of the first voltage and the second voltage at the second latch output terminal, wherein the first voltage is dependent on a voltage applied to the latch voltage supply terminal and the second voltage is dependent on a voltage applied to the first latch control terminal, (b) a first output stage comprising a first switching element, a second switching element, a first voltage supply terminal, a second voltage supply terminal, and a first biasing voltage output terminal, wherein the first switching element is adapted to connect the first biasing voltage output terminal to the first voltage supply terminal in dependency of the voltage at the first latch output terminal, and wherein the second switching element is adapted to connect the first biasing voltage output terminal to the second voltage supply terminal in dependency of the voltage at the second latch output terminal, and (c) a second output stage comprising a third switching element, a fourth switching element, a third voltage supply terminal, a fourth voltage supply terminal, and a second biasing voltage output terminal, wherein the third switching element is adapted to connect the second biasing voltage output terminal to the third voltage supply terminal in dependency of the voltage at the first latch output terminal, and wherein the fourth switching element is adapted to connect the second biasing voltage output terminal to the fourth voltage supply terminal in dependency of the voltage at the second latch output terminal.

This aspect is based on the idea that a single level shifter latch is used to switch the voltage at two biasing voltage output terminals between individual voltage levels which are determined by supply voltages and a voltage applied to a latch control terminal. Thereby a single driver circuit is capable of generating two individual biasing voltages at the same time in dependency on the voltage (i.e. the input signal) provided at the first latch input terminal. In other words, the level shifter latch is operated to flip between two (adjustable) voltages (first voltage and second voltage) in the sense that before flipping the latch, the voltage at the first latch output terminal is e.g. equal to the first voltage while the voltage at the second latch output terminal is equal to the second voltage. Once flipped, this changes such that the voltage at the first latch output terminal is now equal to the second voltage while the voltage at the second latch output terminal is now equal to the first voltage. The output voltages from the latch are used to control the two output stages to provide the respective biasing voltages for the memory device.

Accordingly, the present invention provides a single, compact circuit capable of simultaneously delivering two biasing voltages for a memory device.

According to an embodiment, the level shifter latch comprises a first inverter circuit and a second inverter circuit arranged in cross coupling, wherein an output of the first inverter circuit is coupled to the first latch output terminal and wherein an output of the second inverter circuit is coupled to the second latch output terminal.

Thus, the level shifter latch may be realized using simple components in a simple structure.

According to a further embodiment, each of the first and second inverter circuits comprises a PMOS transistor and an NMOS transistor.

According to a further embodiment, the level shifter latch further comprises a second latch input terminal and a second latch control terminal, the level shifter latch is further adapted to provide the one of the first and second voltages at the first latch output terminal and the other one of the first and second voltages at the second latch output terminal in dependency on a voltage at the second latch input terminal, and the second voltage is further dependent on a voltage applied to the second latch control terminal.

In such embodiments, the driver circuit is even more flexible while still simple to implement.

According to a further embodiment, the second latch input terminal is adapted to receive the inverse of an input signal provided to the first latch input terminal.

In other words, the latch uses one single input signal in direct and inverted form to control the flipping of the latch.

According to a further embodiment, the circuit further comprises a charge pump for selectively providing a predetermined voltage to at least one of the latch voltage supply terminal and the first, second, third and fourth voltage supply terminals.

By using a charge pump, voltages above available supply voltages may be applied (for a limited period of time), adding further to the flexibility with regard to outputting a wide variety of biasing voltages.

According to a further embodiment, the first switching element of the first output stage comprises at least one NMOS transistor, in particular a pair of NMOS transistors arranged in parallel, and/or the second switching element of the first output stage comprises an NMOS transistor.

According to a further embodiment, each of the third and fourth switching elements of the second output stage comprises an NMOS transistor.

In general, it is advantageous to use NMOS transistors as these allow fast voltage changes.

According to a further embodiment, the circuit further comprises one or more cascading elements for protecting one or more other elements against excess voltage.

The cascading elements may in particular be NMOS or PMOS transistors arranged between other transistors to handle a part of a voltage difference which, without the cascading elements, could damage or even destroy the other elements.

According to a further embodiment, the level shifter latch, the first output stage and the second output stage are integrally formed.

In other words, the entire driver circuit is formed as a single monolithic circuit and thus correspondingly small in size.

According to a second aspect, there is provided a memory system comprising (a) a flash memory device, and (b) a driver circuit according to the first aspect or any of the above embodiments thereof, wherein the driver circuit is adapted to provide the voltage at the first biasing voltage output terminal as a control gate biasing voltage and the voltage at the second biasing voltage output terminal as a select gate control signal to the flash memory device.

This aspect is based on the same idea as the first aspect discussed above in that it uses a driver circuit according to the first aspect to provide biasing voltages to the flash memory device.

According to a third aspect, there is provided a method of operating the driver circuit according to the first aspect or any of the above embodiments, the method comprising (a) operating the driver circuit in a first state by (a1) providing a first input voltage to the first latch input terminal, (a2) providing a first control voltage to the first latch control terminal, and (a3) providing a first set of supply voltages to the latch voltage supply terminal and the first, second, third, and fourth voltage supply terminals, (b) flipping the level shifter latch by providing a second input voltage to the first latch input terminal, and (c) operating the driver circuit in a second state by (c1) providing a second control voltage to the first latch control terminal, and (c2) providing a second set of supply voltages to the latch voltage supply terminal and the first, second, third, and fourth voltage supply terminals.

This aspect is essentially based on the same idea as the first and second aspects discussed above in that it provides a method of operating or using the driver circuit.

The method may preferably be implemented in a system according to the second aspect or in any of the embodiments thereof as described above.

According to a fourth aspect, there is provided a computer program comprising computer executable instructions which when executed by a computer causes the computer to perform the steps of the method according to the third aspect.

It should be noted that embodiments of the invention have been described with reference to different subject matters. In particular, some embodiments have been described with reference to method type claims whereas other embodiments have been described with reference to apparatus type claims. However, a person skilled in the art will gather from the above and the following description that, unless otherwise indicated, in addition to any combination of features belonging to one type of subject matter also any combination of features relating to different subject matters, in particular a combination of features of the method type claims and features of the apparatus type claims, is also disclosed with this document.

The aspects defined above and further aspects of the present invention will be apparent from the examples of embodiment to be described hereinafter and are explained with reference to the examples of embodiment. The invention will be described in more detail hereinafter with reference to examples of embodiment to which the invention is, however, not limited.

DETAILED DESCRIPTION

The illustration in the drawing is schematic. It is noted that in different figures, similar or identical elements are provided with the same reference signs or with reference signs, which differ only within the first digit.

Figure 1:
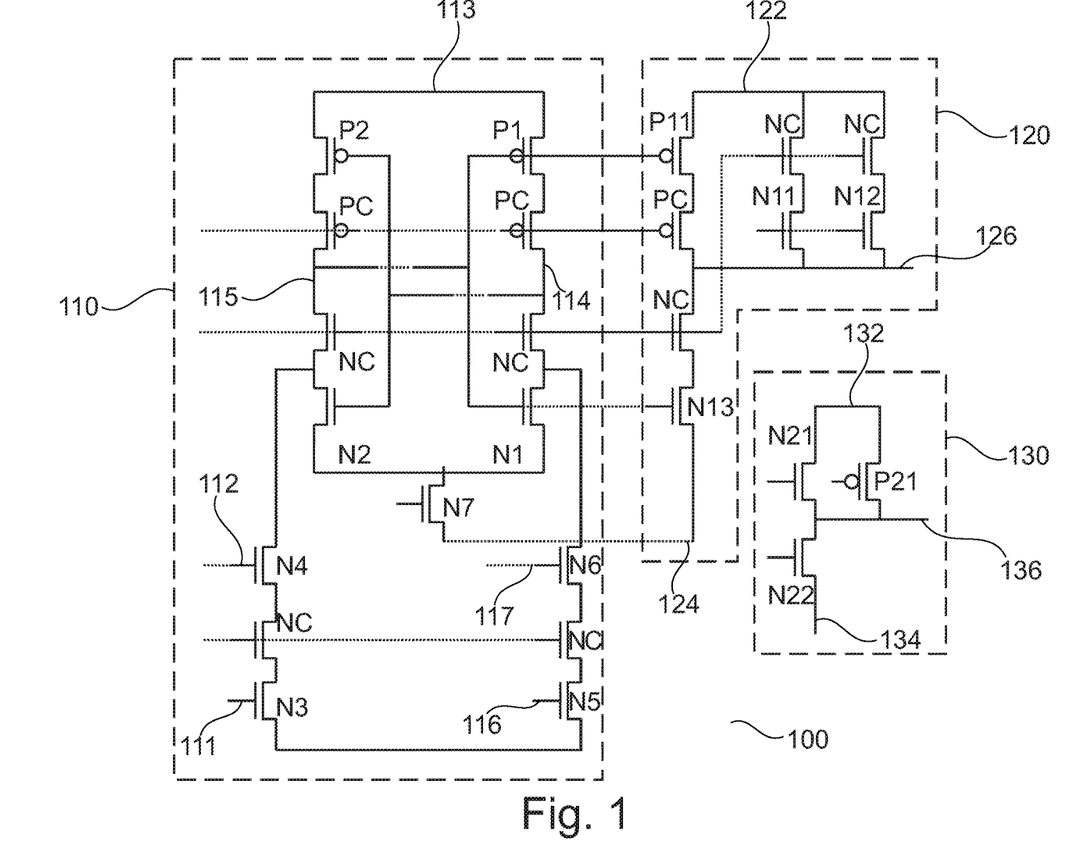
FIG. 1 shows a driver circuit in accordance with an embodiment.

FIG. 1 shows a driver circuit 100 in accordance with an embodiment. The driver circuit comprises a level shifter latch 110, a first output stage 120 and a second output stage 130. The level shifter latch 110 comprises a pair of cross-coupled inverters consisting of PMOS transistor P1 and NMOS transistor N1 respectively PMOS transistor P2 and NMOS transistor N2. Cascading transistors PC and NC are arranged between the transistors of each pair. Below each of the cross coupled inverters N1, P1 respectively N2, P2, two NMOS transistors N3, N4 separated by a cascading NMOS transistor NC respectively N5, N6 separated by cascading NMOS transistor NC are arranged. The lower NMOS transistors N3 and N5 are preferably thin oxide (e.g. GO1) NMOS transistors but may also be GO2 or HV NMOS transistors. This also applies to the cascading transistors NC arranged above each of N3 and N5, respectively. The gates of these lower NMOS transistors N3 and N5 are coupled to respective latch input terminals 111 and 116 for receiving a latch input signal (at terminal 111) and the inverse of the latch input signal (at terminal 116) in order to flip the latch as will be described in more detail below. Similarly, the gates of the NMOS transistors N4 and N6, which are HV (high voltage) NMOS transistors, are respectively coupled to respective latch control terminals 112 and 117 for receiving control voltages determining a lower latch output voltage level as will be described further below. More specifically, the latch control input terminal 112 receives a control signal CGIN_NPASS_MPRG indicating when a memory programming operation is to take place, while the latch control input terminal 117 receives a control signal CGIN_NPASS_MPERS indicating when a memory erase operation is to take place.

The latch 110 further comprises a latch voltage supply terminal 113 for receiving a supply voltage, which also determines an upper latch output voltage level. A first latch output terminal 114 is coupled to the output of the inverter comprising transistors P1 and N1 while a second latch output terminal 115 is coupled to the output of the inverter comprising transistors P2 and N2. Depending on the input signal (and the inverse thereof) as applied to latch input terminals 111 and 116, the voltages at the latch output terminals 114 and 115 may be swapped (or flipped) as will be apparent to a person skilled in the art. More specifically, in a first state the first latch output terminal 114 may have voltage V1 while the second latch output terminal 115 has voltage V2. Once the input signals applied to the latch input terminals 111, 116 are changed, the latch 110 changes to a second state where the output voltages are flipped, i.e. the voltage at the first latch output terminal 114 is now V2 while the voltage at the second latch output terminal 115 is V1. Finally, the level shifter latch 110 comprises an NMOS transistor N7 arranged between the two cross-coupled inverters to allow disconnection of the ground node in order to save power during switching, as discussed further below. It is explicitly noted that the transistor N7 is optional and not essential for the correct functioning of the latch 110.

The first output stage 120 comprises HV NMOS transistors N11 and N12 arranged in parallel as a first switching element with the gates coupled to the first latch output terminal 114. It is noted that other embodiments may be realized with only a single NMOS transistor or with more than two NMOS transistors in parallel. Each of the transistors N11 and N12 is connected in series with an NMOS cascading (also HV) transistor NC and arranged between a first voltage supply terminal 122 and a first biasing voltage output terminal 126. The latter serves to provide a control gate (CG) signal to a flash memory device (not shown). A pair of series connected PMOS transistors P11 and PC (cascading) is connected in parallel with the aforementioned NMOS transistors N11, N12 and 2×NC is furthermore provided. This pair of PMOS transistors P11, PC is only used during PROGRAM and ERASE, not during READ which uses the NMOS transistors N11, N12 and corresponding NCs. The gate of PMOS transistor P11 is coupled to the second latch output terminal 115. The first output stage 120 further comprises HV NMOS transistor N13 arranged in series with NMOS cascading transistor NC between a second voltage supply terminal 124 and the first biasing voltage output terminal 126. The gate of NMOS transistor N13 is coupled to the second latch output terminal 115.

The second output stage 130 comprises a HV NMOS transistor N21 arranged as a third switching element between upper (third) voltage supply terminal 132 and second biasing voltage output terminal 136 with its gate coupled to the first latch output terminal 114. The second output stage 130 further comprises a HV NMOS transistor N22 arranged as a fourth switching element between lower (fourth) voltage supply terminal 134 and second biasing voltage output terminal 136 with its gate coupled to the second latch output terminal 115.

The various cascading NMOS transistors NC and cascading PMOS transistors PC may differ in size, bias and type depending on the specific situation and available voltage, as known in the art.

In earlier driver circuits, both CGIN_NPASS_MPPRG and CGIN_NPASS_MPERS were connected and operated as one single CGIN_NPASS signal. In such circuits, the ground could be forced from both sides into the latch but independently of course (depending on the address), meaning that always one and only row was selected by one corresponding CG-SG driver for any functional cycle execution and all the rest were deselected by the rest of the CG-SG drivers which were not accessed by address. The current implementation allows the logic to control them separately resp. independently and thus allows connecting only one side of the input stage inside all the CG-SG drivers in the memory. Being able to do this in combination with smart signal management, multiple pages can be selected to be erased or programmed. In short, desired pages are selected one after another by arriving addresses and then all erased or programmed in one go instead of executing a corresponding number of ERASE or PROGRAM cycles one by one.

A small positive charge pump (not shown) which can deliver up to 6V is used to supply voltage to the voltage supply terminal 113 and the gates of some cascading transistors NC depending on the circumstances. In particular, this charge pump is used during a READ cycle, mainly as the supply (XDPOS) of the level shifter latch (at voltage supply terminal 113) but also to bias some NMOS switches inside other blocks, where proper and stable drive in combination with short reaction time is required.

Since it was discovered during the design phase, that the cross current in the latch 110 represents approx. 65% of the total current consumed when the latch 110 flips during the READ cycle, an extra CGNEG_NPASS_NMOS transistor N7 was introduced in the circuit. This CGNEG_NPASS pass gate disconnects the CGNEG (0V) supply from the latch 110 and due to that there will be no XDPOS->CGNEG cross current when writing data into the latch during the READ.

In previous flash memories, all the CGs are at 1.2V (reading voltage) in the entire flash matrix during the READ cycle as well as during the Standby mode. Certainly also the control gates of those flash cells which are not read are then continuously kept at 1.2V. The READ cycle is the most executed functional cycle meaning that corresponding voltages are applied for most of the time over the life cycle of the flash memory. It was discovered during endurance silicon measurements that erased cells (the floating gates of which are permanently exposed to READ voltage) are getting degraded due to Stress Induced Leakage Current (SILC). Due to the SILC, some free electrons can be attracted towards the floating gate which leads to increase in threshold voltage. Whereas this is happening in the prior art flash matrix, there is only control gate of desired read cell activated in the new flash memory. All remaining CGs of non-read cells are kept at 0V. This leads to:

(a) Preventing SILC and its resulting cell degradation.

(b) A demand for avoiding the negative effect of the SILC resulted in a need for a fast switchable CG driver. Since fast switching with HV PMOS at 1.2V is not possible in the circuit of previous generation, new concept of the circuitry became demanded as well.

(c) Power saving while charging only one CG instead of all of them (but depends on number of consecutive Read cycles). This also provides a reduction of wake-up time after power-down.

In order to achieve the required speed performance during the READ cycle, high voltage (HV) NMOS transistors are used to discharge but also to charge the CG 126 and SG 136 lines meaning they conduct positive voltages, which might be in some cases unexpected to see. These NMOS branches are used to deliver positive voltage (1.2V) only during the READ. It can be done so because they are biased by newly introduced READ pump high voltage of 6V which then ensures proper drive strength and NMOS biased voltage is then well above the threshold voltage Vth. The minimum value of this HV read supply is set by the speed requirements while its maximum is given by technology limitations on the HV device and maximum power consumption limits.

According to known simple formula and initial conditions, it can be stated:

$$I = C \cdot \Delta V / \Delta t => \Delta t = (C \cdot \Delta V) / I, \text{ where}$$

Δt is the charging speed resp. time we want to minimize,

ΔV is given by the READ cell voltage,

C is the CG or SG signal line capacitance, which is determined by the layout or matrix topology, and Capacitance and current determine the speed since the READ voltage is fixed.

Thus, I is the only parameter that can be optimized.

The obvious choice would be to use a PMOS device to drive the positive voltages towards the CG 126. In that case, the PMOS would require negative voltage of at least −4V at its gate in order to deliver the CG voltage properly resp. within required amount of time during the READ cycle. Another reason this negative voltage would be required is the Margin Mode test where there is a voltage from 0 to 2V applied on the CG. The Margin Mode is explained further below. After evaluating the performance the PMOS would bring and the layout required, it was decided to use NMOS device instead.

Benefits and requirements when using the NMOS in the output buffer:

Replacing PMOS devices by NMOS devices resulted in getting ~2.5× higher strength by nature. Obviously to reach the same strength of the device, 2.5× less layout area is needed. However, there is a need to introduce the 6V READ pump voltage to bias output CG and SG NMOS drivers that will result in higher output current resp. drive strength.

Summarizing, the CG-SG driver circuit 100 serves as the level shifter for both CG and SG signals and then depending on the supply of their output buffers 120 and 130, delivers correct end voltage levels. Since the output buffers 120, 130 are driven by the same latch outputs 114, 115 at the same moment, the CG and SG can switch/rise hand in hand and help each other due to their mutual cross-coupling capacitance. That could help mainly during the READ cycle to reach the end level faster and reduce the charging current. Using the common latch-level shifter 110 will result first of all in area reduction because the CG-SG circuitry is placed as many times as there are number of rows.

In the following, the operation of the driver circuit 100 during READ, ERASE and PROGRAM operations will be discussed in detail.

Figure 2A:
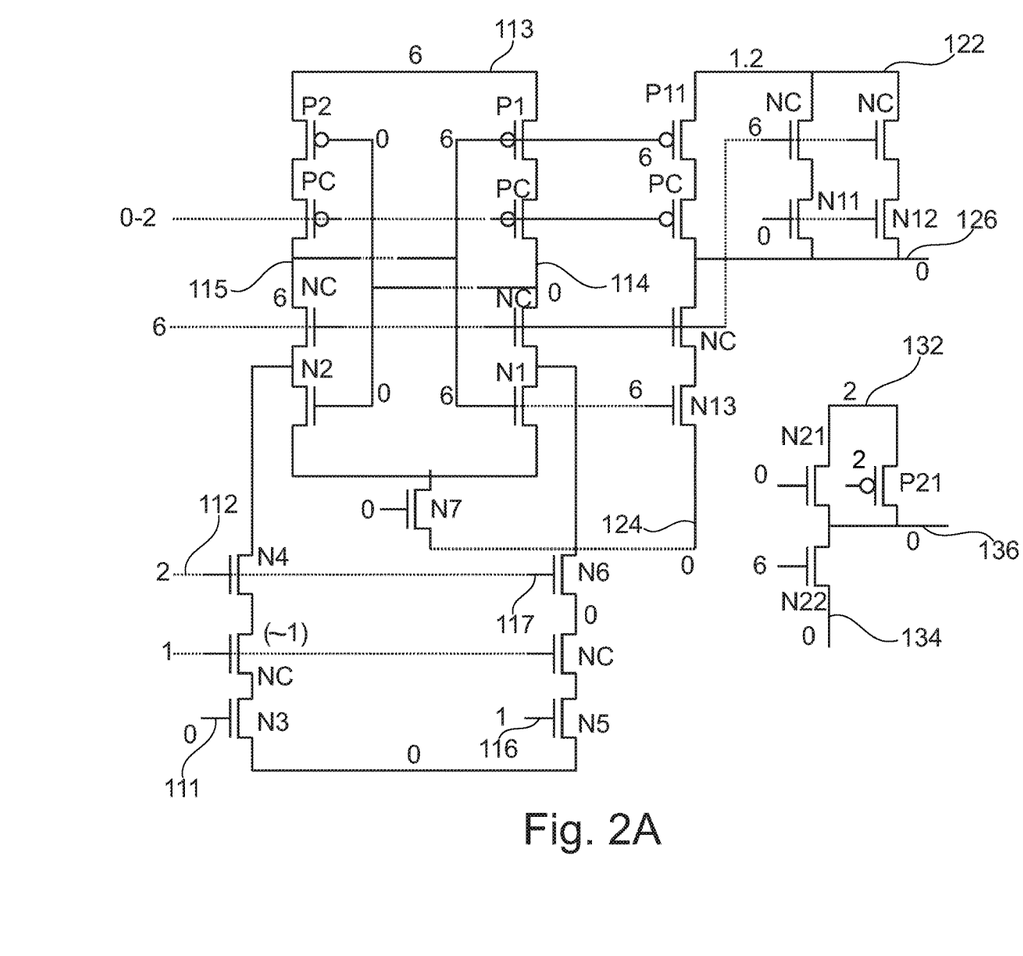
FIG. 2A shows the driver circuit of FIG. 1 in a first state during a read operation in accordance with an embodiment.
Figure 2B:
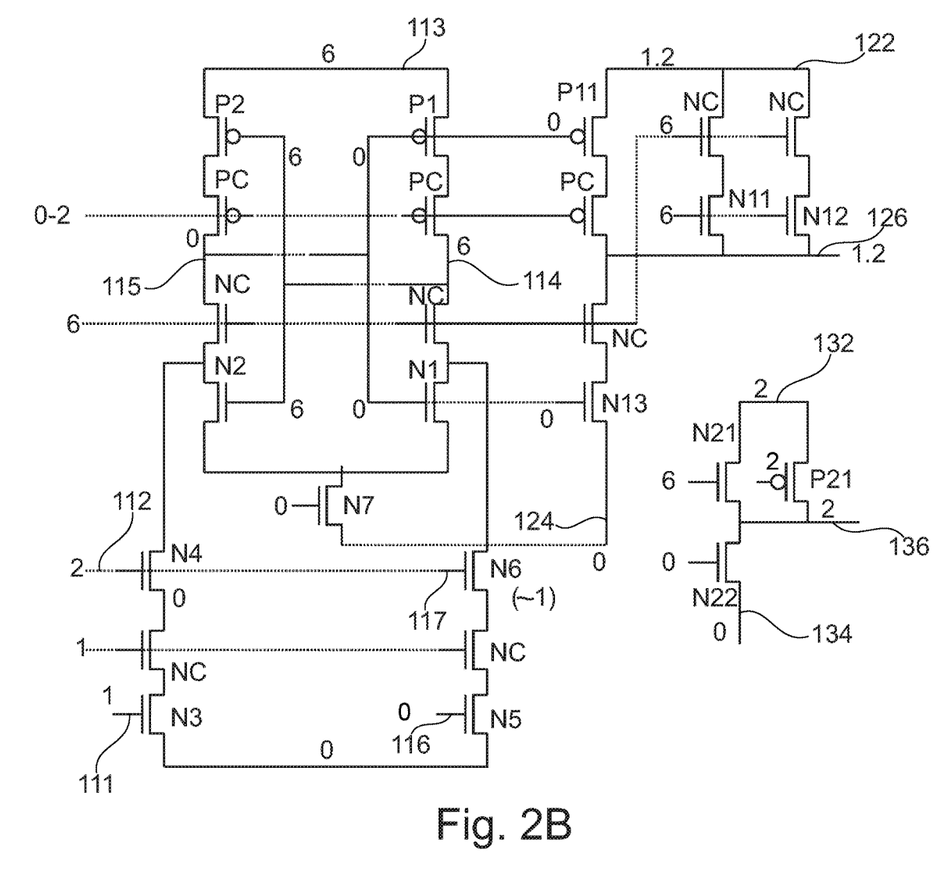
FIG. 2B shows the driver circuit of FIG. 1 in a second state during a read operation in accordance with an embodiment.

FIG. 2A shows the driver circuit 100 of FIG. 1 in a first state (unselected) during a read operation in accordance with an embodiment, while FIG. 2B shows the driver circuit 100 in a second state (selected) during the read operation.

The FIGS. 2A and 2B show all applied voltages in the CG-SG driver circuit 100 when executing the READ cycle. There is 6V for the supply of the latch (also referred to as XDPOS) at terminal 113 and cascading voltage of HV NMOSes NC in the latch (also referred to as CGNCASC) 110. Use of 6V for cascading devices has multiple reasons. The higher the voltage on the gate is, the smaller the device can be. These devices serve also as a decoupling capacitance of the XDPOS supply such that peaks during the latch switching are minimized. Only one level shifter-latch switches at a time but it has the decoupling capacitance of the full row decoder. It is important to mention here that the latch control signals CGIN_NPASS_MPPRG and CGIN_NPASS_MPERS at terminals 112 and 117 act together and have 2V (vddnv) applied. Note that these signals, as described further below, are operated separately when executing the ERASE and PROGRAM cycles.

Before the READ cycle starts, READ pump voltage is applied to the circuit as supply 113 of the latch 110. After the address comes into the memory and gets processed by the row predecoder, the ground level is written into the latch 110 from the bottom either by left or right hand side branch. Since the latch 110 has 6V as its supply 113, internal nodes resp. latch outputs flip between 0 and 6V. This brings the 6V bias voltage for the CG and SG output stages resp. CG and SG output buffer drivers 120 and 130. As a result thereof, activated NMOSes having proper strength now, will ramp up the CG 126 and SG 136 to their accurate voltage level of 1.2V (CG) resp. 2V (SG) very quickly.

Another benefit of having the common LS 110 for the CG and SG is that the crosstalk effect caused by the mutual cap of these lines can be used. As they switch at the same moment, they can help each other to reach their end level faster.

Only high supply voltage used for the latch to flip is 6V during the READ cycle. A lower voltage (vddnv) is used when selecting the CG and SG during the ERASE and PROGRAM. After the desired latch is selected by the input address, the XDPOS (at terminal 113), CGPOS (at first voltage supply terminal 122), SGPOS (at terminal 132) resp. CGNEG (at terminal 124) and SGNEG (at terminal 134) are ramped up resp. down to voltages defined for the flash cell to be properly erased or programmed.

Since the CG-SG driver 100 is connected directly to the READ pump, proper attention must be paid to the circuit's active current as well as leakage current during the READ cycle. Here can be mentioned again the two cascading PMOSes PC in the LS branches serving there as current limiting devices. These directly reduce the power consumption during the switching.

Figure 3A:
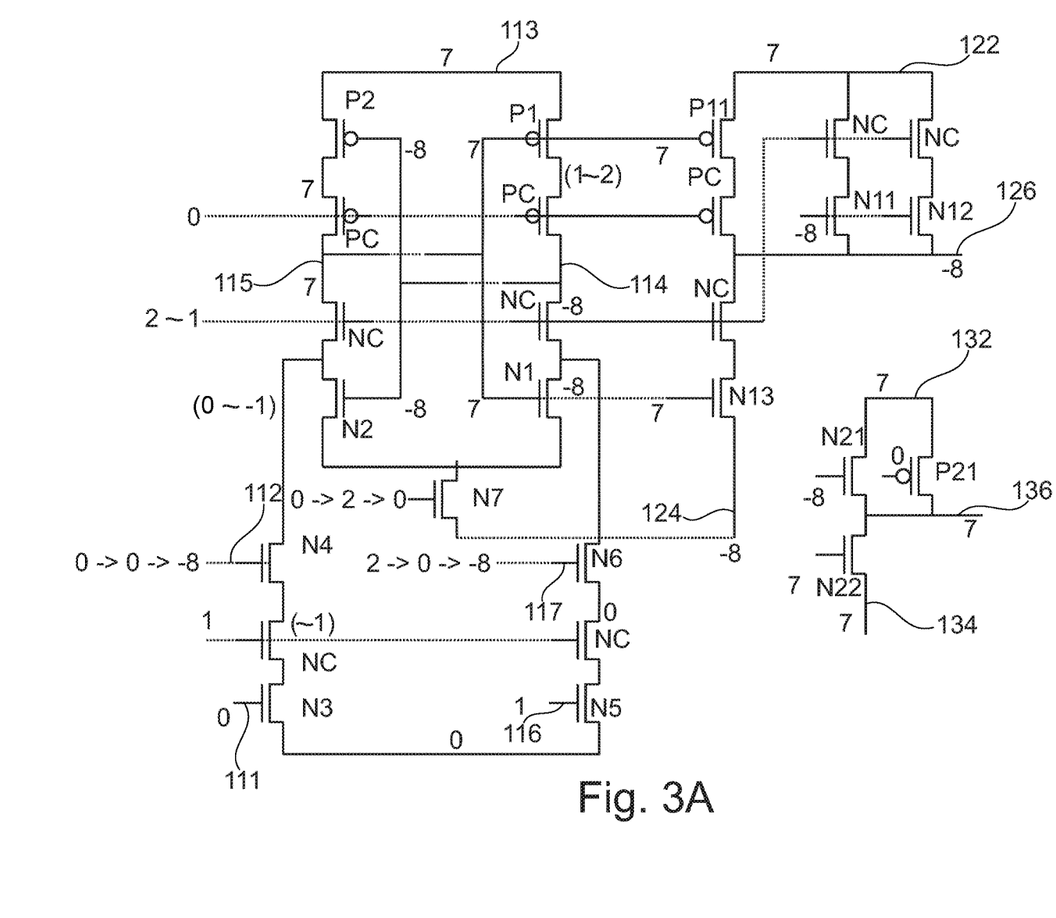
FIG. 3A shows the driver circuit of FIG. 1 in a first state during an erase operation in accordance with an embodiment.
Figure 3B:
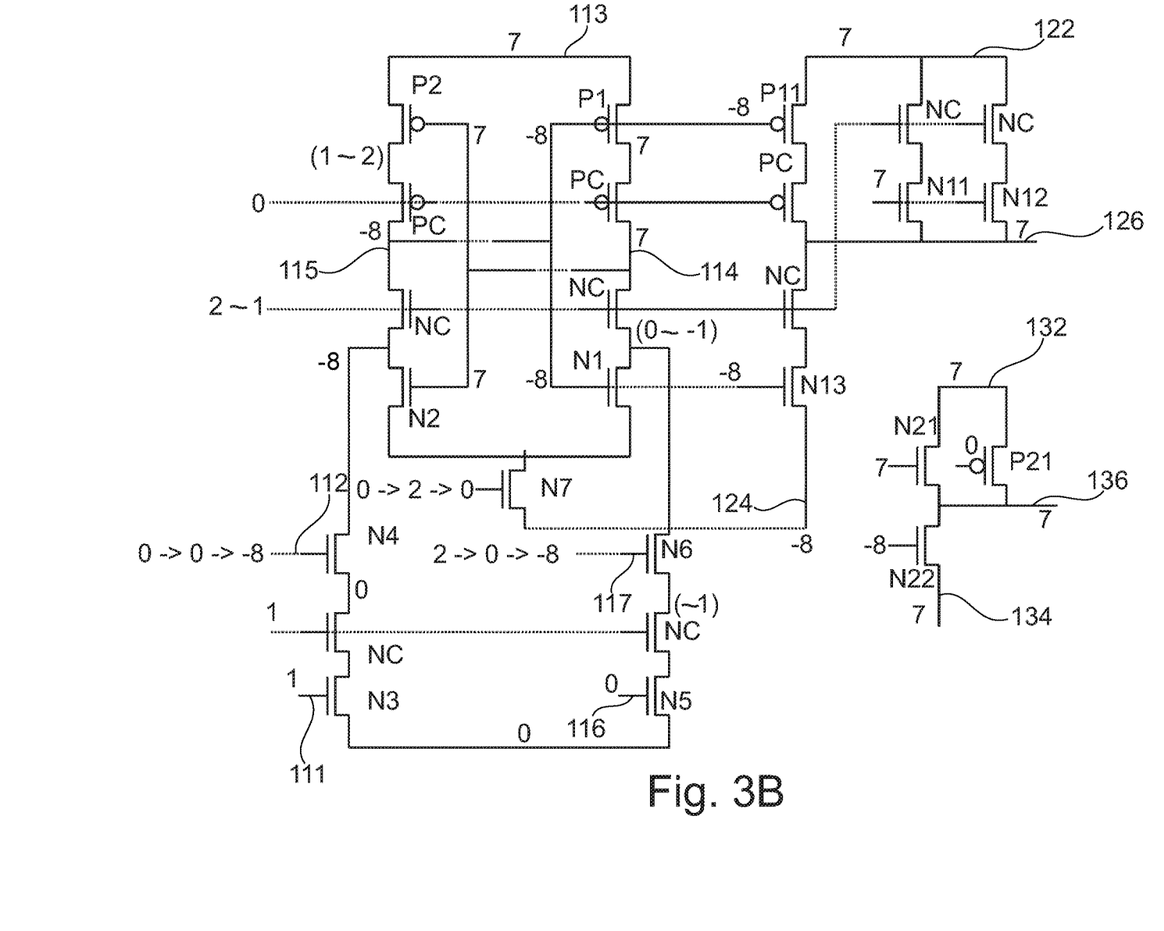
FIG. 3B shows the driver circuit of FIG. 1 in a second state during an erase operation in accordance with an embodiment.

FIG. 3A shows the driver circuit 100 of FIG. 1 in a first state (unselected) during an erase operation in accordance with an embodiment, while FIG. 3B shows the driver circuit 100 in a second state (selected) during the erase operation.

Note that, different from the READ cycle discussed above in conjunction with FIGS. 2A and 2B, the control signals CGIN NPASS MPPRG 112 and CGIN_NPASS_MPERS 117 have different voltage levels when operated. In the ERASE cycle, the right hand side branch N5, N6 is used to pass (CGIN_NPASS_MPERS; 2->0->−8) the GND into the latch resp. to select the desired CG.

Figure 4A:
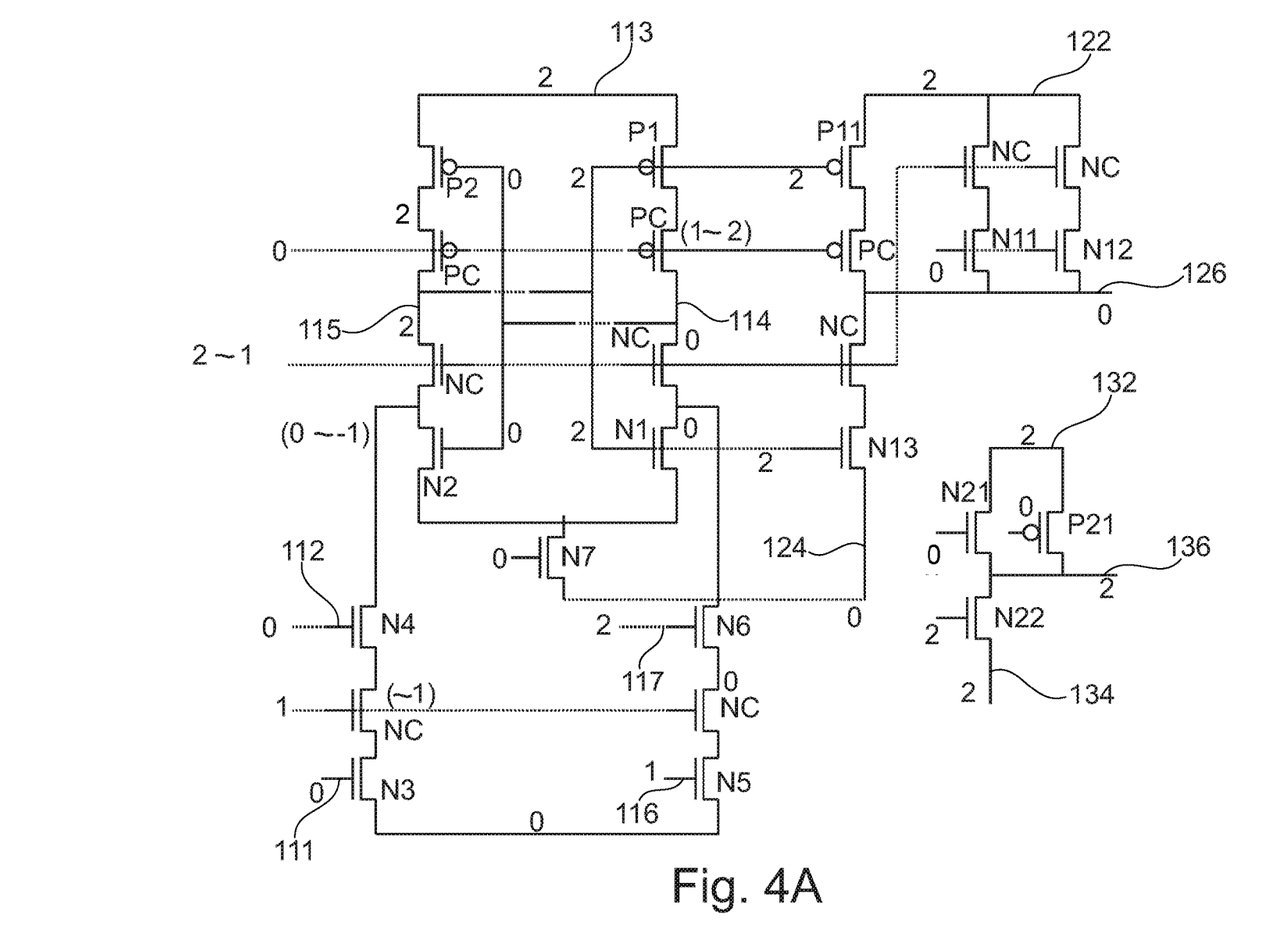
FIG. 4A shows the driver circuit of FIG. 1 in a first state during an erase or programming operation in accordance with an embodiment.
Figure 4B:
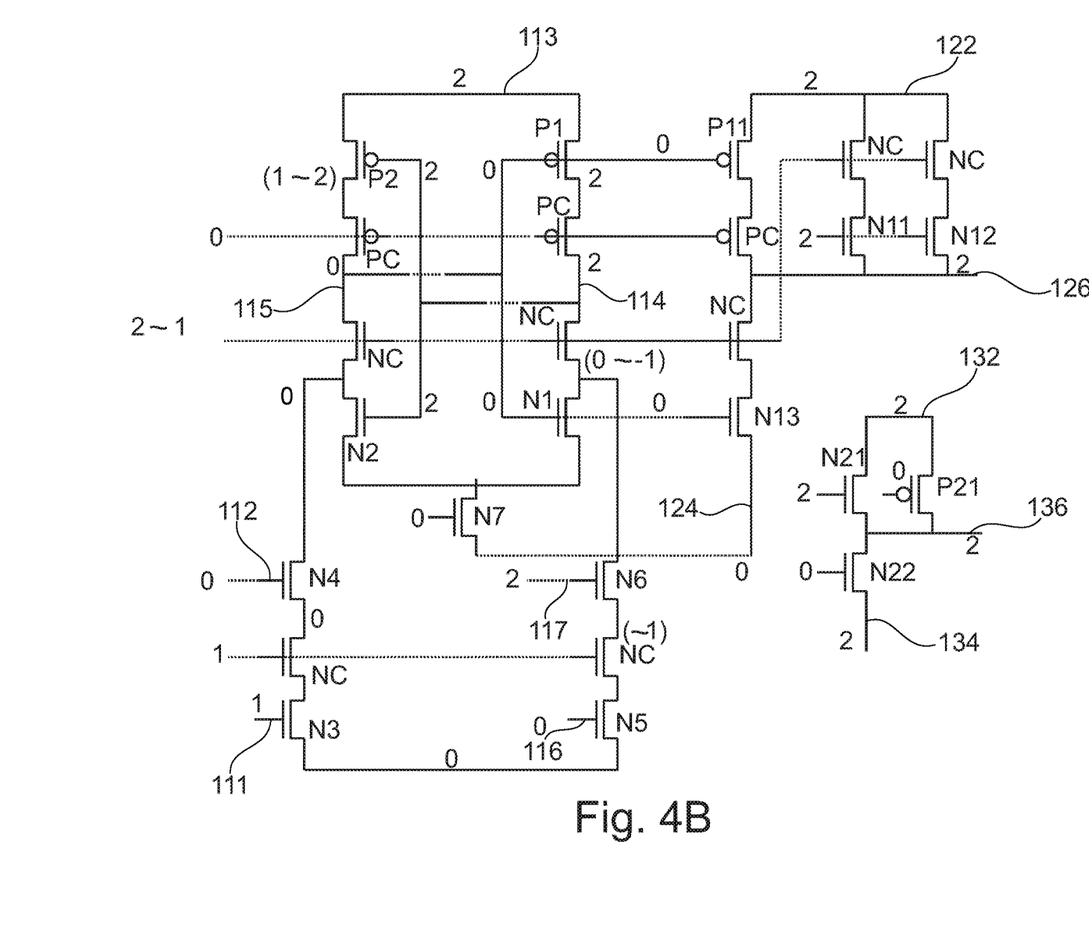
FIG. 4B shows the driver circuit of FIG. 1 in a second state during an erase or programming operation in accordance with an embodiment.

As shown in FIGS. 4A and 4B, the very high (7V) and low (−8V) voltages used for the latch and buffer supplies 113, 122, 124, 132, 134, which have their origin in positive and negative pumps, are not present in the circuit 100 when the latch 110 is switching resp. selection is processed. At the moment of latch switching, there are vddnv (2V max)

instead of 7V and GND instead of −8V connected into the latch. It is executed at strong top level external voltage domains and no high voltage switching is done. After the desired CG and SG are selected for the ERASE cycle (GND and vddnv) and the rest de-selected (CGs at vddnv), positive and negative charge pumps are connected into the circuit via a system of HV switches. The vddnv voltage at the XDPOS 113, CGPOS 122 and both SGPOS 132 and SGNEG 134 is slowly ramped up towards the 7V, analogically the GND node is lowered towards the −8V to be used by the addressed CG-SG driver 100. Note that the CG 126 selected for erasing is at negative voltage compared to READ and PROGRAM cycles.

When there are high voltages applied in the circuit, the bottom part (N3, N5, 2×NC) operating with vddcore domain is isolated from the latch by putting both CGIN_NPASS nodes 112, 117 down to negative pump voltage. This protects sensitive thinner-gate oxide GO1 N3, N5 devices from facing high voltages which would break them immediately.

Figure 5A:
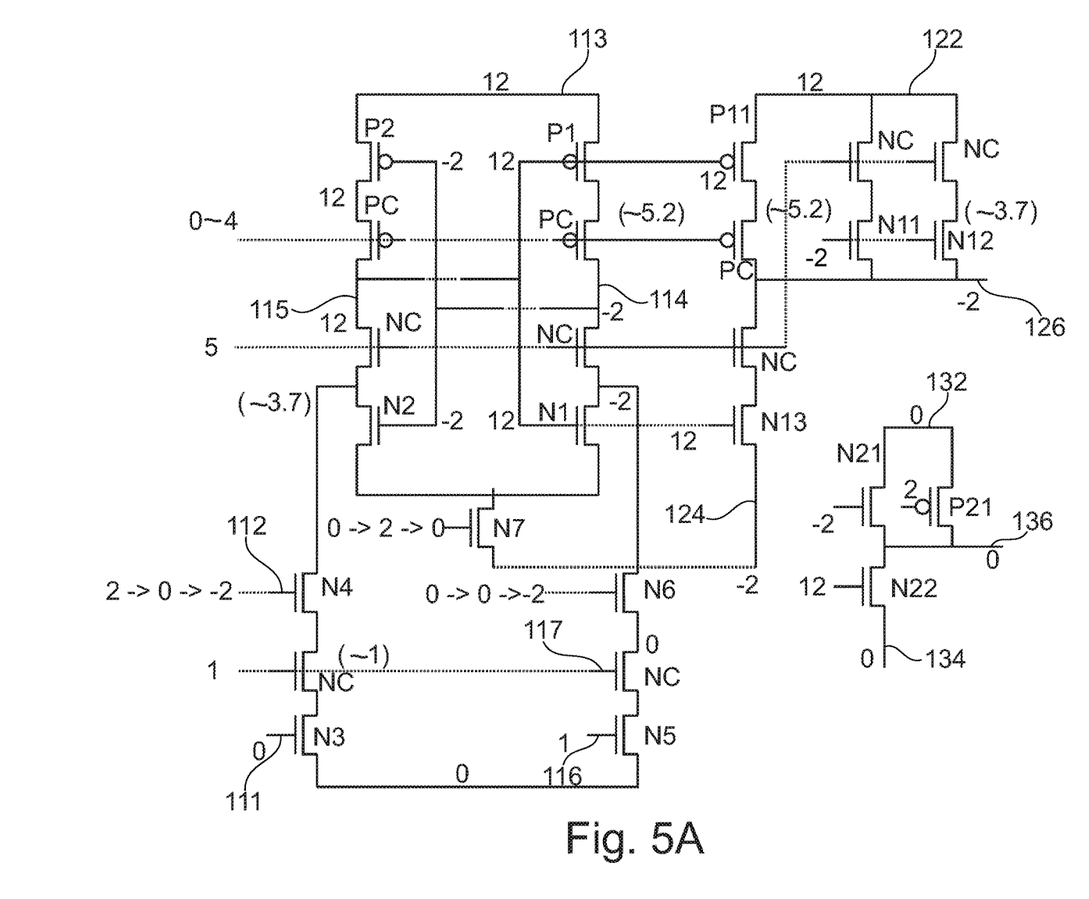
FIG. 5A shows the driver circuit of FIG. 1 in a first state during a programming operation in accordance with an embodiment.
Figure 5B:
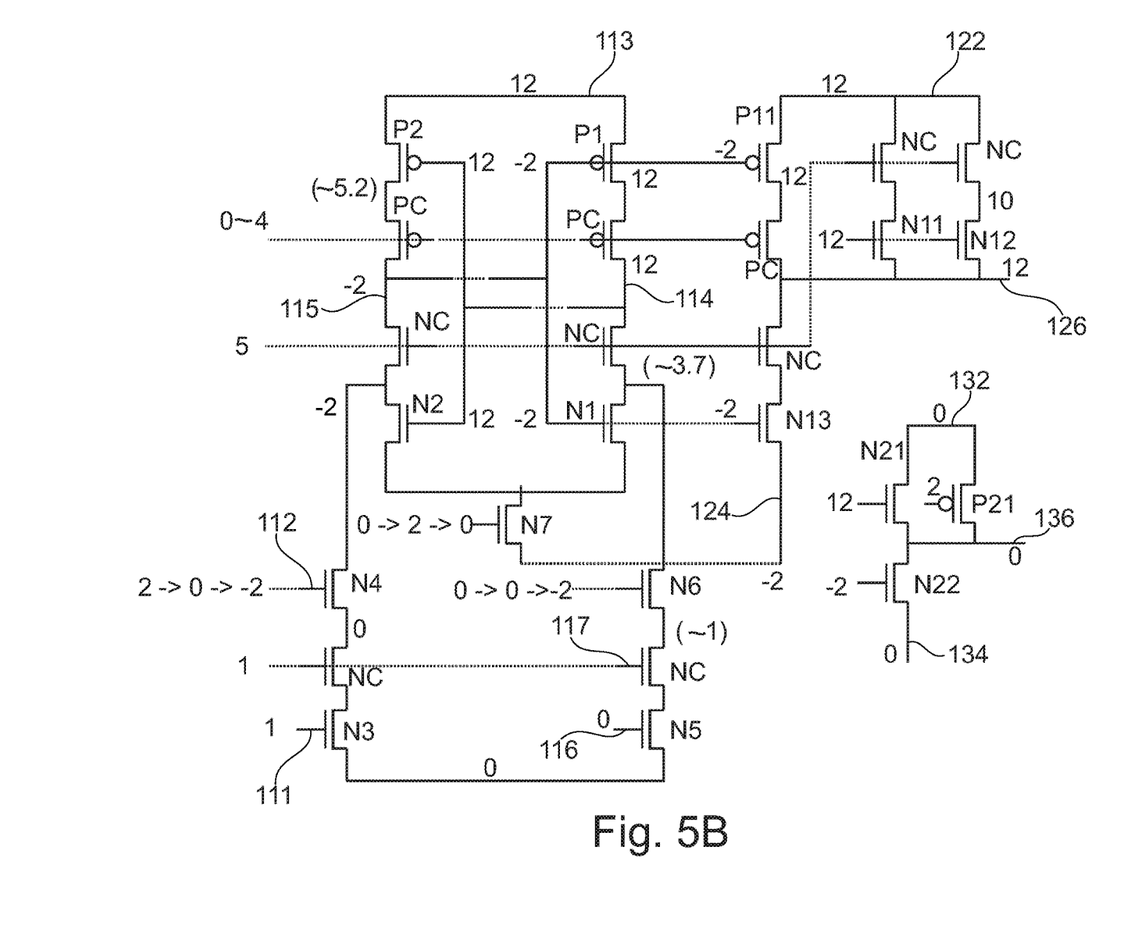
FIG. 5B shows the driver circuit of FIG. 1 in a second state during a programming operation in accordance with an embodiment.

FIG. 5A shows the driver circuit 100 of FIG. 1 in a first state (unselected) during a programming operation in accordance with an embodiment, while FIG. 5B shows the driver circuit 100 in a second state (selected) during the programming operation.

Compared to the ERASE cycle discussed above in conjunction with FIGS. 3A, 3B, 4A, and 4B, it is noted that different cascade voltages are applied to the cascading transistors PC and NC between the transistors P1 and N1 respectively P2 and N2. That is, the voltage (CGPCASC) applied to the PMOS cascading transistors PC is 4V and the voltage (CGNCASC) applied to the NMOS cascading transistors NC is 5V. Further, the left hand side branch (CGIN_NPASS_MPPRG; 2->0->−2) is used to force GND into the latch 110 and select the CG. Finally, different positive (POS) and negative (NEG) high voltages are required for the programming of the flash memory cell. When executing the PROGRAM cycle, again vddnv and GND are used for the selection phase (similar to FIGS. 4A and 4B), then ramped up to 12V and lowered down to −2V. Of course, the bottom GO1 devices N3 and N5 are isolated and protected from HV by applying the most negative voltage available, which is −2V at this time.

Recapitulating the above, the driver circuit 100 makes it possible to have the control and select gate selection done by one shared circuit, thereby reducing area. Furthermore, the circuit 100 provides fast and accurate switching of the CG and SG, allows for margin mode testing, makes it possible to avoid a feared retention after endurance problem (SILC), to have better and less GBD (Gate Break Down) conditions, and it enables multi-page selection allowing multiple rows to be selected and then Erased or Programmed at once.

With regard to the above mentioned margin mode testing, this is e.g. implemented in the flash memory as a special mode available to be tested during the READ cycle. More specifically, it is the test mode which measures resp. monitors the degradation of programmed cell over life time. To be able to test it, any voltage from the interval of 2V down to 0V should be available to be applied on the CG. Since an NMOS output stage delivers CG end voltage level, voltages down to 0V can be directly delivered by the existing circuitry. And since the NMOS output stage is biased by READ pump voltage and thus has a pretty good drive strength, then also upper limit voltage of 2V can be properly delivered to the CG without any noticeable timing penalty.

It is noted that, unless otherwise indicated, the use of terms such as "upper", "lower", "left", and "right" refers solely to the orientation of the corresponding drawing.

It is noted that the term "comprising" does not exclude other elements or steps and that the use of the articles "a" or "an" does not exclude a plurality. Also elements described in association with different embodiments may be combined. It should also be noted that reference signs in the claims should not be construed as limiting the scope of the claims.

The invention claimed is:

1. A driver circuit for providing biasing voltages to a memory device, in particular a flash memory device, the driver circuit comprising
   a level shifter latch comprising a first latch input terminal, a first latch control terminal, a latch voltage supply terminal, a first latch output terminal, and a second latch output terminal, wherein the level shifter latch is adapted to provide, in dependency of a voltage at the first latch input terminal, one of a first voltage and a second voltage at the first latch output terminal and the other one of the first voltage and the second voltage at the second latch output terminal, wherein the first voltage is dependent on a voltage applied to the latch voltage supply terminal and the second voltage is dependent on a voltage applied to the first latch control terminal,
   a first output stage comprising a first switching element, a second switching element, a first voltage supply terminal, a second voltage supply terminal, and a first biasing voltage output terminal, wherein the first switching element is adapted to connect the first biasing voltage output terminal to the first voltage supply terminal in dependency of the voltage at the first latch output terminal, and wherein the second switching element is adapted to connect the first biasing voltage output terminal to the second voltage supply terminal in dependency of the voltage at the second latch output terminal, and
   a second output stage comprising a third switching element, a fourth switching element, a third voltage supply terminal, a fourth voltage supply terminal, and a second biasing voltage output terminal, wherein the third switching element is adapted to connect the second biasing voltage output terminal to the third voltage supply terminal in dependency of the voltage at the first latch output terminal, and wherein the fourth switching element is adapted to connect the second biasing voltage output terminal to the fourth voltage supply terminal in dependency of the voltage at the second latch output terminal.

2. The circuit according to claim 1, wherein the level shifter latch comprises a first inverter circuit and a second inverter circuit arranged in cross coupling, wherein an output of the first inverter circuit is coupled to the first latch output terminal and wherein an output of the second inverter circuit is coupled to the second latch output terminal.

3. The circuit according to claim 2, wherein each of the first and second inverter circuits comprises a PMOS transistor and an NMOS transistor.

4. The circuit according to claim 1, wherein the level shifter latch further comprises a second latch input terminal and a second latch control terminal, wherein the level shifter latch is further adapted to provide the one of the first and second voltages at the first latch output terminal and the other one of the first and second voltages at the second latch output terminal in dependency on a voltage at the second latch input terminal, and wherein the second voltage is further dependent on a voltage applied to the second latch control terminal.

5. The circuit according to claim 4, wherein the second latch input terminal is adapted to receive the inverse of an input signal provided to the first latch input terminal.

6. The circuit according to claim 1, further comprising a voltage source, in particular charge pump, for selectively providing a predetermined voltage to at least one of the latch voltage supply terminal and the first, second, third and fourth voltage supply terminals.

7. The circuit according to claim 1, wherein the first switching element of the first output stage comprises at least one NMOS transistor, in particular a pair of NMOS transistors arranged in parallel, and/or wherein the second switching element of the first output stage comprises an NMOS transistor.

8. The circuit according to claim 1, wherein each of the third and fourth switching elements of the second output stage comprises an NMOS transistor.

9. The circuit according to claim 1, further comprising one or more cascading elements for protecting one or more other elements against excess voltage.

10. The circuit according to claim 1, wherein the level shifter latch, the first output stage and the second output stage are integrally formed.

11. A memory system comprising:
a flash memory device, and
a driver circuit according to claim 1,
wherein the driver circuit is adapted to provide the voltage at the first biasing voltage output terminal as a control gate biasing voltage and the voltage at the second biasing voltage output terminal as a select gate control signal to the flash memory device.

12. A method of operating the driver circuit according to claim 1, the method comprising:
operating the driver circuit in a first state by
providing a first input voltage to the first latch input terminal,
providing a first control voltage to the first latch control terminal, and
providing a first set of supply voltages to the latch voltage supply terminal and the first, second, third, and fourth voltage supply terminals,
flipping the level shifter latch by providing a second input voltage to the first latch input terminal, and
operating the driver circuit in a second state by
providing a second control voltage to the first latch control terminal, and
providing a second set of supply voltages to the latch voltage supply terminal and the first, second, third, and fourth voltage supply terminals.

13. A computer program product encoded in a non-transitory computer readable medium, the computer program product comprising computer executable instructions which, when executed by a computer, causes the computer to perform the steps of the method according to claim 12.

* * * * *